United States Patent
Chuang et al.

(10) Patent No.: US 9,115,310 B2
(45) Date of Patent: Aug. 25, 2015

(54) FLUORESCENT MATERIAL AND LIGHT EMITTING DEVICE USING THE SAME

(75) Inventors: Yao-Tsung Chuang, Tainan (TW); Jen-Shrong Uen, Tainan (TW); Chih-Lung Lin, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 61 days.

(21) Appl. No.: 13/470,651

(22) Filed: May 14, 2012

(65) Prior Publication Data

US 2013/0099657 A1    Apr. 25, 2013

(30) Foreign Application Priority Data

Oct. 25, 2011    (TW) .............................. 100138714 A

(51) Int. Cl.
*H01J 1/63* (2006.01)
*C09K 11/78* (2006.01)
*C09K 11/80* (2006.01)
*C09K 11/77* (2006.01)
*H01L 33/50* (2010.01)

(52) U.S. Cl.
CPC ........... *C09K 11/7774* (2013.01); *H01L 33/502* (2013.01)

(58) Field of Classification Search
CPC .................................................. C09K 11/7774
USPC .................................................. 252/301.4 R
See application file for complete search history.

(56) References Cited

U.S. PATENT DOCUMENTS

| 2009/0008663 A1* | 1/2009 | Shimizu et al. ................. 257/98 |
| 2013/0063926 A1* | 3/2013 | Winkler et al. ................. 362/84 |

FOREIGN PATENT DOCUMENTS

| DE | 10 2010 021341 |   | * 11/2011 |
| JP | 2005008844 |   | 1/2005 |
| JP | 2008050493 |   | 3/2008 |
| TW | 201144411 A1 |   | 12/2011 |
| WO | 2011020751 A1 |   | 2/2011 |

OTHER PUBLICATIONS

Wu et al, "Spectral Properties of Various Cerium Doped Garnet Phosphors for Application in White GaN-bsed LEDs", Mat. Res. Soc. Symp. Proc., vol. 659, Jan. 2001, GGI 1.8.1-1.8.6.*
JP Office Action dated Oct. 15, 2013.
English Abstract translation of JP2005008844 (Published Jan. 13, 2005).
English Abstract translation of JP2008050493 (Published Mar. 6, 2008).

* cited by examiner

*Primary Examiner* — Carol M Koslow
(74) *Attorney, Agent, or Firm* — McClure, Qualey & Rodack, LLP

(57) ABSTRACT

A fluorescent material and a light emitting device using the same are provided. The fluorescent material has a general formula of $((Lu_m A_{1-m})_z Ce_{1-z})_3 Q_5 O_{12}$, wherein $0<m<1$ and $0<z<1$. A includes at least one of element Y, element La, and element Gd. Q includes at least one of element Al, element Ga, and element In. $1.74 \leq (m*z+1-z)*3 \leq 3.0$ and $0.1 \leq (1-m)*z*3 \leq 1.35$.

7 Claims, 1 Drawing Sheet

FLUORESCENT MATERIAL AND LIGHT EMITTING DEVICE USING THE SAME

This application claims the benefit of Taiwan application Serial No. 100138714, filed Oct. 25, 2011, the subject matter of which is incorporated herein by reference.

BACKGROUND OF THE INVENTION

1. Field of the Invention

The invention relates in general to a fluorescent material, and particularly a light emitting device using the fluorescent material.

2. Description of the Related Art

In recent years, light emitting devices utilizing semiconductors for emitting lights have been intensively used. In particular, light emitting diodes (LED) have been developed successfully. Compared to conventional light emitting equipments, such as cold cathode fluorescent lamps and incandescent lamps, light emitting devices utilizing light emitting diodes have advantages of high emitting efficiency, small volumes, low power consumption, and low cost. Therefore, such light emitting devices are used in various light sources. Semiconductor light emitting devices comprise semiconductor light emitting elements and fluorescent materials. Fluorescent materials can absorb and convert lights emitted from semiconductor light emitting elements. Lights emitted directly from semiconductor light emitting elements and lights converted by fluorescent materials can be mixed for use. Such light emitting devices can be used in various areas, such as fluorescent lights, car lighting, display devices, and liquid crystal backlights.

Current white LED light emitting devices are developed according to anaglyphic principle. Fluorescent materials absorb a blue light emitted from semiconductor light emitting elements and convert it into a yellow light. When the blue light and the yellow light enter human eyes simultaneously, a white light is observed by the human. For example, the above-mentioned effect can be achieved via a semiconductor of InGaN and a yellow fluorescent material having a general formula of $(Y,Gd)_3(Al,Ga)_5O_{12}:Ce$.

Further, a white light can be generated by utilizing a combination of a light emitting element which emits ultraviolet lights and a fluorescent material which emits g RGB (red, green, and blue) lights. Furthermore, when a light emitting element emits an ultraviolet light, the ultraviolet light is converted by a fluorescent material to emit a blue light, and then another fluorescent material is excited by the blue light to emit a yellow light, as such, a white light is generated by mixing the blue light and the yellow light.

However, light emitting devices have been used in more and more areas, and the luminous brightness of the commercially yellow fluorescent material $(Y,Gd)_3(Al,Ga)_5O_{12}:Ce$ series is evidently insufficient, therefore, the industrial needs are not satisfied. In addition, when luminous brightness is increased, luminescent chromaticity shift easily occurs. Therefore, developing a fluorescent material which satisfies the needs for various applications of light emitting devices as well as increases luminance has become one of the most important goals.

SUMMARY OF THE INVENTION

The present invention is directed to a fluorescent material and a light emitting device having excellent luminescent properties.

A fluorescent material is provided. The fluorescent material has a general formula of $((Lu_mA_{1-m})_zCe_{1-z})_3Q_5O_{12}$, wherein $0<m<1$ and $0<z<1$. A comprises one of element Y (yttrium), element La (lanthanium), and element Gd (gadolinium). Q comprises one of element Al (aluminum), element Ga (gallium), and element In (indium). Lu is lutetium, O is oxygen, Ce is cerium, $1.74 \leq (m*z+1-z)*3 \leq 3.0$, and $0.1 \leq (1-m)*z*3 \leq 1.35$.

A fluorescent material is provided. The fluorescent material has a general formula of $((Lu_mA_{1-m})_zCe_{1-z})_3Q_5O_{12}$, wherein $0<m<1$ and $0<z<1$. A comprises one of element Y, element La, and element Gd. Q comprises one of element Al, element Ga, and element In. Lu is lutetium, O is oxygen, Ce is cerium, $0.7 \leq (m*z+1-z)*3 \leq 0.8$, and $2.2 \leq (1-m)*(z)*3 \leq 2.35$. When the fluorescent material is excited by a light having a wavelength of 455 nm, the CIE 1931 chromaticity coordinates of an emitted light from the fluorescent material is $0.450<x<0.486$ and $0.504<y<0.545$.

A light emitting device is provided. The light emitting device comprises a light emitting element and one of any of the above-mentioned fluorescent materials. When the fluorescent material is excited by a light emitted from the light emitting element, the fluorescent material converts the light emitted from the light emitting element to emit a light having a wavelength different from the wavelength of the exciting light.

DETAILED DESCRIPTION OF THE INVENTION

Figure 1:
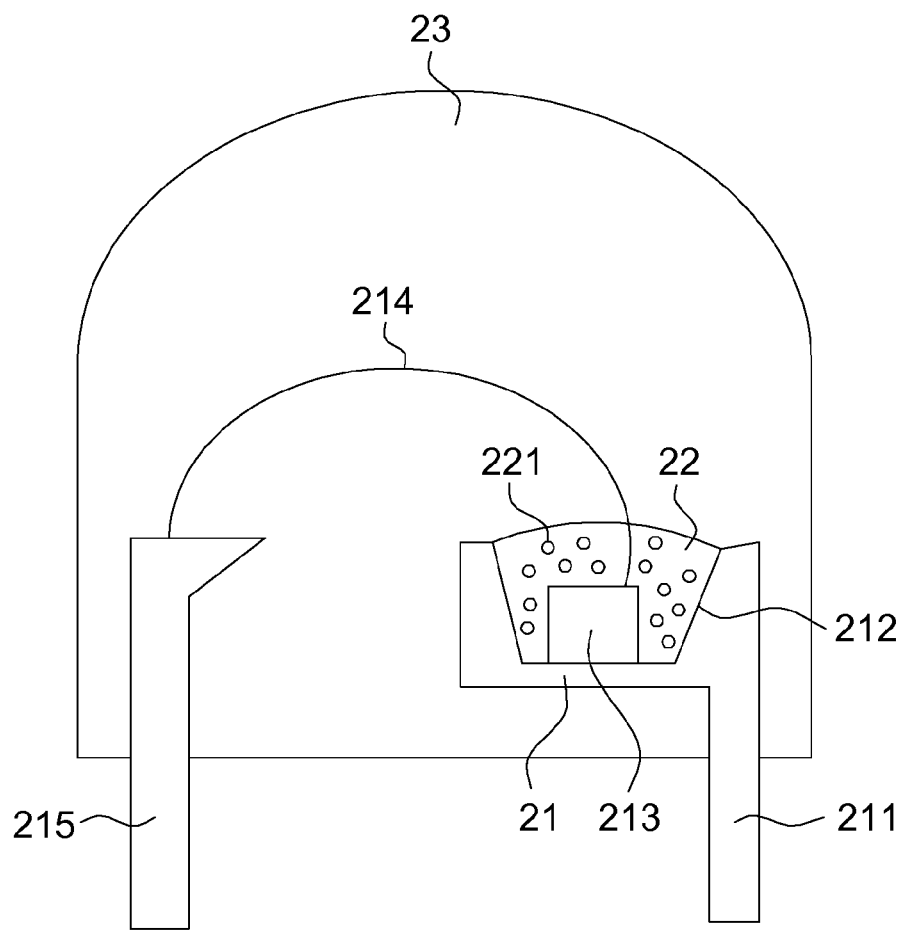
FIG. 1 shows a cross-sectional view of the light emitting device according to an embodiment of the present disclosure.

In the following detailed description, for purposes of explanation, numerous preferred embodiments along with Figures are set forth in order to provide a thorough understanding of the disclosed embodiments.

The embodiments of the invention are related to a fluorescent material, which has a general formula of $((Lu_mA_{1-m})_zCe_{1-z})_3Q_5O_{12}$, wherein symbol Lu represents element lutetium, symbol Ce represents element cerium, and symbol O represents element oxygen. A comprises at least one of element Y (yttrium), element La (lanthanium), and element Gd (gadolinium). Q comprises at least one of element Al (aluminum), element Ga (gallium), and element In (indium).

In the general formula, the molar ratio of Lu:A:Ce:Q:O can be represented by $m*z*3:(1-m)*z*3:(1-z)*3:5:12$, wherein symbol "*" represents a mathematical product sign, and symbol "−" represents a mathematical minus sign. In other words, in the fluorescent material, when O is 12 molar parts, Lu is $m*z*3$ molar parts, A is $(1-m)*z*3$ molar parts, Ce is $(1-z)*3$ molar parts, and Q is 5 molar parts.

$0<m<1$ and $0<z<1$.

In an embodiment, in the fluorescent material, when O is 12 molar parts, Ce is 0.095~0.135 molar parts, which means that $(1-z)*3=0.095~0.135$.

In an embodiment, A is at least one of element Y, element La, and element Gd. For example, A has a general formula of $La_nGd_gY_{1-n-g}$, wherein $0 \leq n<1$ and $0 \leq g<1$. In other words, in the fluorescent material, when O is 12 molar parts, La is $n*(1-m)*z*3$ molar parts, Gd is $g*(1-m)*z*3$ molar parts, and Y is $(1-n-g)*(1-m)*z*3$ molar parts. In an embodiment, $n*(1-m)*z*3=0~0.1$, and $g*(1-m)*z*3=0~0.1$.

In an embodiment, Q is at least one of element Al, element Ga, and element In. For example, Q has a general formula of $Al_rGa_jIn_{1-r-j}$, wherein $0<r\leq1$ and $0\leq j<1$. In other words, in the fluorescent material, when O is 12 molar parts, Al is r*5 molar parts, Ga is j*5 molar parts, and In is (1−r−j)*5 molar parts. In an embodiment, j*5=0~0.3.

In an embodiment, in the fluorescent material, $1.74\leq(m*z+1-z)*3\leq3.0$, and $0.1\leq(1-m)*z*3\leq1.35$, which means when O is 12 molar parts, the sum of the molar parts of Lu and the molar parts of Ce is 1.74 to 3.0, and A is 0.1~1.35 molar parts. The above can also be represented as $0.1\leq(1-m)*z*3\leq1.27$. In the embodiment, when the fluorescent material is excited by a light having a wavelength of 455 nm, the CIE 1931 chromaticity coordinates of an emitted light from the fluorescent material is $0.349<x<0.444$ and $0.538<y<0.584$.

For example, when the fluorescent material complies with $2.5\leq(m*z+1-z)*3\leq3.0$ and $0.1\leq(1-m)*z*3\leq0.21$, and the fluorescent material is excited by a light having a wavelength of 455 nm, the CIE 1931 chromaticity coordinates of an emitted light from the fluorescent material is $0.370<x<0.400$ and $0.570<y<0.580$.

For example, when the fluorescent material complies with $2.3\leq(m*z+1-z)*3\leq2.49$ and $0.22\leq(1-m)*z*3\leq0.70$, and the fluorescent material is excited by a light having a wavelength of 455 nm, the CIE 1931 chromaticity coordinates of an emitted light from the fluorescent material is $0.400<x<0.418$ and $0.560<y<0.570$.

For example, when the fluorescent material complies with $1.70\leq(m*z+1-z)*3\leq2.29$ and $0.8\leq(1-m)*z*3\leq1.35$, and the fluorescent material is excited by a light having a wavelength of 455 nm, the CIE 1931 chromaticity coordinates of an emitted light from the fluorescent material is $0.418<x<0.426$ and $0.545<y<0.560$.

In another embodiment, the fluorescent material complies with $0.7\leq(m*z+1-z)*3\leq0.8$ and $2.2\leq(1-m)*(z)*3\leq2.35$. In this embodiment, when the fluorescent material is excited by a light having a wavelength of 455 nm, the CIE 1931 chromaticity coordinates of an emitted light from the fluorescent material is $0.450<x<0.486$, $0.504<y<0.545$, or $0.504<y<0.532$.

For example, when the fluorescent material complies with $0.7\leq(m*z+1-z)*3\leq0.77$ and $2.20\leq(1-m)*z*3\leq2.30$, and the fluorescent material is excited by a light having a wavelength of 455 nm, the CIE 1931 chromaticity coordinates of an emitted light from the fluorescent material is $0.451<x<0.480$ and $0.525<y<0.545$.

In an embodiment, the fluorescent material is in powder form.

The fluorescent material according to an embodiment can be prepared by various methods. For example, the fluorescent material can be prepared by the following methods, such as formation of a cover layer on an inner wall of a crucible, sintering condition and sintering frequency of the fluorescent material, multiple washing by water, and etc.

The crucible can be aluminum oxide, boron nitride, or graphite, and the materials chosen for the crucible is not limited to the materials aforementioned. The cover layer on the inner wall of the crucible can be formed with various materials in a high temperature sintering process. For example, one of the raw materials of the to-be-sintered fluorescent material or a mixture of the raw materials can be sintered to form the cover layer. The sintering condition for the cover layer can be 850° C.~1800° C. and 0.5~10 hours. When the sintering temperature is too low or the sintering time duration is too short, the effective cover layer may not be formed successfully. When the sintering time duration is too long or the sintering temperature is too high, a satisfying economic efficiency is not achieved. The cover layer can prevent impurities, such as Si and Ca, from being released from the crucible and entering the fluorescent material under high temperature, hence influencing the properties of the fluorescent material.

Besides, under the sintering atmosphere, a multiple sintering process allows the raw materials of the fluorescent material to enter into the site of crystal lattice, and the impurities is replaced and removed, hence to further control the content of impurities in the fluorescent material. As such, the luminous properties and stability of the fluorescent material is increased. Impurities adhered to the surface can be washed off by water for multiple times, hence the influence of impurities on luminous properties of the fluorescent material is prevented.

The raw materials of the fluorescent material can be metal oxides, metal compounds, or any material which can form oxides via heating. Element Y is taken for an example, the raw material can be yttrium oxide, yttrium hydride, yttrium carbonate, yttrium hydroxide, and etc. The raw materials can be mixed by a dry process or a wet process, such as a dry ball milling method or a wet ball milling method with addition of a solvent, and is not limited to a specific method.

Herein, a fluxing agent can be added into the raw materials depending on the conditions applied. The fluxing agent can be a halide, such as NaF, KF, $BaF_3$, $SrF_2$, $MgF_2$, $AlF_3$, $YF_3$, NaCl, $BaCl_2$, and etc. In an embodiment, when the fluorescent material is 100 weight parts, the fluxing agent is 0.01~5 weight parts.

The fluorescent material can be prepared by weighing the raw materials with a specific ratio, mixing the raw materials, placing the raw materials into the crucible having a cover layer, and sintering the raw materials in the crucible in a high temperature furnace. The sintering atmosphere is a non-oxidizing gas, such as nitrogen, hydrogen, ammonia, argon, or an arbitrary combination of the above-mentioned gases. The sintering temperature for the fluorescent material is above 1000° C. and below 1800° C., and preferably above 1200° C. and below 1600° C. The heating rate is 5~15° C./min. The fluorescent material with fine particles can be obtained when sintered in a lower temperature in the range above-mentioned, and the fluorescent material with bigger particle sizes can be obtained when sintered in a higher temperature in the range above-mentioned. The sintering time duration varies depending on the types of the raw materials chosen. The sintering time duration is preferably 0.5~5 hours.

After the sintering step is completed, the sintered product is cooled to room temperature, pulverized by methods such as ball milling or industrial pulverizing, washed by water, filtered, dried, and sorted to obtain the fluorescent material of the invention. The $D_{50}$ particle size of the fluorescent material is preferably 0.5~30 μm, and more preferably 2~20 μm. It is relatively easy to use the fluorescent material with particle sizes in the above-mentioned range in coating and filling, and hence the illumination efficiency is increased. When the particle size of the fluorescent material is too small, the luminous brightness is influenced. When the particle size of the fluorescent material is too large, sedimentation of the fluorescent material occurs easily, causing it difficult to use the fluorescent material. The main wavelength range of the light absorbed by the fluorescent material of the invention is between 200 nm to 550 nm. Further, the main wavelength range of the light converted by and emitted from the fluorescent material of the invention is preferably between 500 nm to 600 nm.

The fluorescent material according to the embodiments can be used in various kinds of light emitting devices, which include vacuum fluorescent display (VFD), field emission display (FED), plasma display panel (PDP), cathode ray tube (CRT), light emitting diode (LED), and etc.

In an embodiment, the light emitting device includes a light emitting element and the fluorescent material described above. The fluorescent material is excited by a light emitted from the light emitting element and converts the light emitted from the light emitting element to emit a light having a wavelength different from the wavelength of the exciting light.

The light emitting element can be a semiconductor light emitting element, such as semiconductors comprising zinc sulfide or gallium nitride. In view of illumination efficiency, using a semiconductor of gallium nitride is preferable. The light emitting element is manufactured by forming a semiconductor of gallium nitride on a substrate by metal organic chemical vapor deposition (MOCVD) or hydride vapor phase epitaxy (HVPE). The light emitting element made of $In_\alpha Al_\beta Ga_{1-\alpha-\beta} N$ ($0 \le \alpha$, $0 \le \beta$, $\alpha+\beta<1$) is the most preferable. The semiconductor structure can be a homogeneous structure, such as metal-insulator semiconductor (MIS), PIN linkage, and PN linkage, a heterojunction structure, or a double heterojunction structure. The wavelength of the emitting light can be decided according to the materials of the semiconductor layer or the mixed crystal level. Preferably, the light emitted from the light emitting element of the light emitting device is 300 nm-550 nm, and more preferably 330~500 nm. The fluorescent material according to the embodiments of the invention can be mixed with a transparent material to form a wavelength conversion material. The transparent material can be epoxy, silicone resin, glass, thermoplastics, and etc., which lights can pass through. The wavelength conversion material comprises at least a single layer wavelength conversion material formed with the fluorescent material or a laminated multilayer wavelength conversion material formed with the fluorescent material. The wavelength conversion material is disposed on the illumination path on the semiconductor light emitting element. For example, the wavelength conversion material is coated directly on the surface of the light emitting element, the wavelength conversion material is made into a mold which covers the light emitting element as an encapsulation, the wavelength conversion material is formed on the surface of an encapsulation, or the wavelength conversion material is formed on an optical plate or an optical film and arranged in front of the projecting side of the LED light.

FIG. 1 shows a cross-sectional view of the light emitting device according to an embodiment of the present disclosure. The light emitting device comprises a light emitting unit 21, a fluorescence layer 22, and an encapsulating layer 23.

The light emitting unit 21 comprises a conductive base 211 having a concave bearing surface 212, a light emitting element 213 disposed in the concave bearing surface 212 and electrically connected to the base 211, a connecting wire 214 electrically connected to the light emitting element 213, a conducting wire 215 electrically connected to the connecting wire 214. The base 211 and the conducting wire 215 can cooperate to supply external electrical energy to the light emitting element 213. The light emitting element 213 can convert the electrical energy to light energy and emit it out. An example of the invention is to adhere a commercial available InGaN light emitting element 213 (Chi Mei Lighting Technology Corp.) of light emitting wavelength of 455 nm on the concave bearing surface 212 of the base 211 with a conductive silver paste (BQ6886, Uninwell International), and then the connecting wire 214 electrically connected to the light emitting element 213 and the conducting wire 215 are extended from the top surface of the light emitting element 213.

The fluorescence layer 22 covers the light emitting element 213. After the fluorescent materials 221 contained in the fluorescence layer 22 are excited by the light emitted from the light emitting element 213, the fluorescent materials 221 converts the light emitted from the light emitting element 213 to emit a light having a wavelength different from the wavelength of the exciting light. In the example, the fluorescence layer 22 is formed by coating a polysiloxane resin with the fluorescent materials 221 contained therein on the external surface of the light emitting element 213 followed by drying and hardening.

The encapsulating layer 23 covers a part of the base 211 of the light emitting unit 21, connecting wire 214, a part of the conducting wire 215, and the fluorescence layer 22.

In the light emitting device of the invention, the fluorescent material of the invention can either be used independently or by cooperating with fluorescent materials of other light emitting characteristics, such that a light emitting device capable of emitting desired colors of light is constructed.

For example, a blue light emitting element of 420 nm~500 nm, a red fluorescent material emitting light of 600 nm~650 nm (such as $CaAlSiN_3$:Eu), and the fluorescent material of the invention are assembled to manufacture a light emitting device. Red light and yellow light will be emitted respectively when the fluorescent materials are illuminated by the blue light emitted from the light emitting element, and the lights will be mixed with the blue light emitted from the light emitting element to become a white light emitting device (such as a light apparatus, a light emitting diode, and etc.)

The invention is illustrated with the following examples. It is to be understood that the examples are used for exemplification and not limited thereto.

Figure 2:
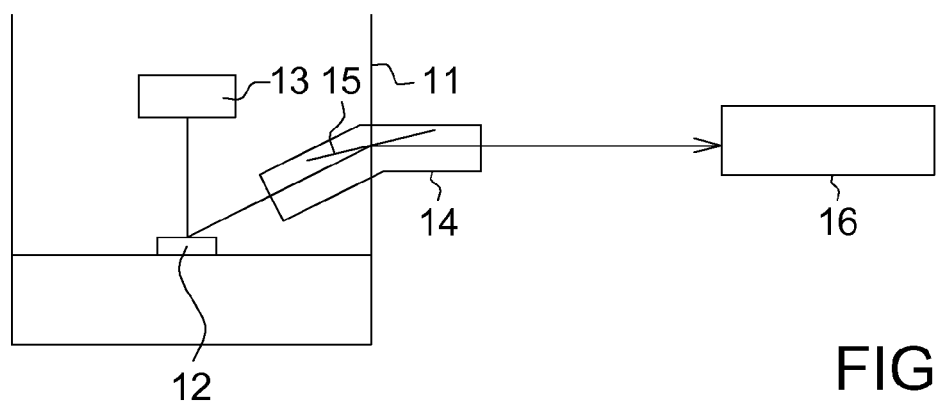
FIG. 2 shows the measurement apparatus of the characteristics of the light emitted from the fluorescent material.

Description of measurement methods and raw materials:

(1) Luminescence Spectrum of the Fluorescent Material:

The measurement apparatus of the characteristics of the light emitted from the fluorescent material is as shown in FIG. 2. The measurement is carried out as follows. 1.8 grams of sample is taken into a sample holder 12 having a diameter of 12 cm and pressed, so that the sample is uniformly distributed in the sample holder 12. The sample holder 12 is then placed inside a black box body 11. A light source 13 of wavelength of 455 nm is disposed vertically above the sample with a distance of 5 cm away from the sample. The sample is irradiated with the light source 13. The fluorescent light is directed horizontally into a brightness meter 16 (TOPCON, SR-3A) via a reflective mirror 15. The reflective mirror 15 is disposed in a light guide tube 14 having a diameter of 2 cm and directs the fluorescent light emitted from the fluorescent material. The light guide tube 14 and the light source form an angle of 45°. The distance between the reflective mirror 15 and the sample holder 12 is 8 cm, and the distance between the brightness meter 16 and the reflective mirror 15 is 40 cm. The brightness meter 16 applies a field 1° detection mode.

(2) Analysis of Average Particle Size $D_{50}$ of the Fluorescent Material:

The measurement is carried out with Beckman Coulter Multisizer-3. $D_{50}$ represents that the cumulative volume of particles with particle sizes smaller than the value is 50% of the total volume of all particles.

(3) Raw Materials:

$Y_2O_3$ (Sigma-Aldrich)

$Al_2O_3$ (Sasol North America Pural BT)

$CeO_2$ (Shanghai Yuelong Rare Earth New Materials Co., LTD)

$AlF_3$ (Metalleare earth limited)

$Gd_2O_3$ (Hongfan Aluminium material Co., LTD)

$Ga_2O_3$ (Sigma-Aldrich)

Lu$_2$O$_3$ (Kuangchou Kinfung Rare Earth Minmetals material Co., LTD)

La$_2$O$_3$ (Changshu Sanetronic Rare Earth Smeltery)

(4) Preparation of the Light Emitting Element:

In the light emitting element, a commercial blue LED element with an illumination center of 455 nm is used. In the embodiment, the LED element is made of a silicon carbide substrate and InGaN.

<Manufacturing the Fluorescent Material>

The manufacturing method of the fluorescent material is as follows. Raw materials of Y$_2$O$_3$, Al$_2$O$_3$ (Sasol Pural BT), Ga$_2$O$_3$, CeO$_2$, AlF$_3$, Lu$_2$O$_3$, La$_2$O$_3$, and Gd$_2$O$_3$ are mixed homogeneously, and the ratio of the above raw materials complies with the conditions shown in Table 1. 10 grams of mixed raw materials and 20~30 grams of pure water are mixed homogeneously and then coated uniformly on the inner walls of a 500 mL crucible made of aluminum oxide. The crucible is then put into a high temperature furnace to be heated. The atmosphere inside the furnace is nitrogen. The temperature inside the furnace is raised slowly from room temperature to 1500° C., stays at 1500° C. for 4 hours for sintering, and then is dropped slowly to room temperature for cooling. A cover layer is formed on the inner walls of the crucible by the above-mentioned method. Raw materials are put into the crucible with the cover layer, and then the crucible is put into a high temperature furnace. The atmosphere inside the furnace is pure nitrogen. The temperature inside the furnace is raised slowly from room temperature to 1450° C., stays at 1450° C. for 4 hours for sintering, and then is dropped slowly to room temperature for cooling. The sintered product is then pulverized, ball milled, washed by water twice, filtered, and sorted. And then, the treated sintered product is put into the high temperature furnace again. The atmosphere inside the furnace is nitrogen:hydrogen=95 wt %:5 wt %. The temperature inside the furnace is raised slowly from room temperature to 1200° C., stays at 1200° C. for 2 hours for sintering, and then is dropped slowly to room temperature for cooling. The second-time sintered product is then pulverized, ball milled, washed by water twice, filtered, and sorted.

The second-time treated sintered product is put into the high temperature furnace again. The atmosphere inside the furnace is nitrogen:hydrogen=95 wt %:5 wt %. The temperature inside the furnace is raised slowly from room temperature to 1500° C., stays at 1500° C. for 4 hours for sintering, and then is dropped slowly to room temperature for cooling. The third-time sintered product is then pulverized, ball milled, washed by water twice, filtered, and sorted, and then a fluorescent material is obtained. The mean particle size D$_{50}$ of the fluorescent material is 13 μm.

TABLE 1

Molar ratios of the elements in the composition of the fluorescent material.

| | Lu | Ce | Y | La | Gd | Ga | Al |
|---|---|---|---|---|---|---|---|
| Example 1 | 2.78 | 0.12 | 0.10 | 0 | 0 | 0.15 | 4.85 |
| Example 2 | 2.74 | 0.12 | 0.04 | 0.10 | 0 | 0.10 | 4.90 |
| Example 3 | 2.28 | 0.12 | 0.60 | 0 | 0 | 0.15 | 4.85 |
| Example 4 | 2.24 | 0.12 | 0.44 | 0.10 | 0.10 | 0.30 | 4.70 |
| Example 5 | 1.63 | 0.12 | 1.10 | 0.05 | 0.10 | 0.15 | 4.85 |
| Example 6 | 1.60 | 0.135 | 1.165 | 0 | 0.10 | 0.30 | 4.70 |
| Example 7 | 0.58 | 0.12 | 2.30 | 0 | 0 | 0.15 | 4.85 |
| Example 8 | 0.65 | 0.12 | 2.10 | 0.05 | 0.08 | 0.15 | 4.85 |
| Example 9 | 0.565 | 0.135 | 2.20 | 0 | 0.10 | 0.00 | 5.00 |
| Comparative example 1 | 1.50 | 0.12 | 0.80 | 0.20 | 0.20 | 0.15 | 4.85 |
| Comparative example 2 | 2.92 | 0.08 | 0.00 | 0 | 0 | 0.50 | 4.50 |
| Comparative example 3 | 1.00 | 0.12 | 1.50 | 0.38 | 0 | 0.10 | 4.90 |
| Comparative example 4 | 0.50 | 0.12 | 2.00 | 0 | 0.30 | 0.10 | 4.90 |
| Comparative example 5 | 0.65 | 0.12 | 1.90 | 0 | 0.23 | 0.20 | 4.80 |
| Comparative example 6 | 0.90 | 0.12 | 1.60 | 0 | 0.38 | 0.15 | 4.85 |

The fluorescent materials of examples 1~6 comply with the condition: $1.74 \leq (m*z+1-z)*3 \leq 3.0$ and $0.1 \leq (1-m)*z*3 \leq 1.35$, which means that in the fluorescent material, when O is 12 molar parts, the sum of the molar parts of Lu and the molar parts of Ce is 1.74 to 3.0, and the sum of the molar parts of Y, the molar parts of La, and the molar parts of Gd is 0.1 to 1.35. Example 1 is taken as an example, $(m*z+1-z)*3=Lu+Ce=2.78+0.12=2.90$, and $(1-m)*z*3=Y+La+Gd=0.10+0+0=0.1$.

The fluorescent materials of examples 7~9 comply with the condition: $0.7 \leq (m*z+1-z)*3 \leq 0.8$ and $2.2 \leq (1-m)*(z)*3 \leq 2.35$, which means that in the fluorescent material, when O is 12 molar parts, the sum of the molar parts of Lu and the molar parts of Ce is 0.7 to 0.8, and the sum of the molar parts of Y, the molar parts of Ge, and the molar parts of La is 2.2 to 2.35.

The fluorescent materials of comparative examples 1~6 do not comply with the conditions of the fluorescent materials of examples 1~6. The fluorescent materials of comparative examples 1~6 do not comply with the conditions of the fluorescent materials of examples 7~9, neither.

<Optical Characteristics of the Fluorescent Material>

Table 2 shows the results from the luminescence spectra of the fluorescent materials measured under the same conditions. As shown in Table 2, the luminous intensities of the fluorescent materials of the examples are larger than the luminous intensities of the fluorescent materials of the comparative examples. According to the experimental data, when the general formula of the fluorescent material complies with $1.74 \leq (m*z+1-z)*3 \leq 3.0$ and $0.1 \leq (1-m)*z*3 \leq 1.35$, the fluorescent material can both satisfy the chromaticity coordinates required by industry and have an increased luminous intensity to reach the level of high brightness.

TABLE 2

| | Luminous intensity | Chromaticity coordinates (x) | Chromaticity coordinates (y) | Wavelength of emitting light (nm) |
|---|---|---|---|---|
| Example 1 | 108% | 0.3762 | 0.5722 | 534 |
| Example 2 | 108% | 0.3762 | 0.5722 | 534 |
| Example 3 | 110% | 0.4045 | 0.5617 | 545 |
| Example 4 | 110% | 0.4045 | 0.5617 | 545 |
| Example 5 | 107% | 0.4253 | 0.5498 | 550 |
| Example 6 | 107% | 0.4253 | 0.5498 | 550 |
| Example 7 | 100% | 0.4528 | 0.5307 | 558 |
| Example 8 | 100% | 0.4528 | 0.5307 | 558 |
| Example 9 | 100% | 0.4860 | 0.5040 | 570 |
| Comparative example 1 | 94% | 0.430 | 0.546 | 553 |
| Comparative example 2 | 99% | 0.349 | 0.584 | 524 |
| Comparative example 3 | 95% | 0.444 | 0.538 | 534 |

TABLE 2-continued

| | Luminous intensity | Chromaticity coordinates (x) | Chromaticity coordinates (y) | Wavelength of emitting light (nm) |
|---|---|---|---|---|
| Comparative example 4 | 90% | 0.464 | 0.522 | 564 |
| Comparative example 5 | 92% | 0.456 | 0.528 | 562 |
| Comparative example 6 | 96% | 0.453 | 0.531 | 558 |

The luminous intensity of the fluorescent material of example 9 is taken as a reference of 100%, and the luminous intensities in Table 2 are calculated accordingly.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fluorescent material, having a general formula of $((Lu_mA_{1-m})_zCe_{1-z})_3Q_5O_{12}$, wherein $0<m<1$, $0<z<1$, A comprises element Y (yttrium) and element La (lanthanum), Q comprises at least one of element Al (aluminum), element Ga (gallium), and element In (indium), Lu is lutetium, O is oxygen, Ce is cerium, $0.1 \leq (1-m)*z*3 \leq 0.21$, and when the fluorescent material is excited by a light having a wavelength of 455 nm, the CIE 1931 chromaticity coordinates of an emitted light from the fluorescent material is $0.370<x<0.400$ and $0.570<y<0.580$.

2. The fluorescent material according to claim 1, wherein:
A has a general formula of $La_nY_{1-n}$, $0<n<1$;
Q has a general formula of $Al_rGa_jIn_{1-r-j}$, $0<r\leq1$, $0\leq j<1$; and $0<n*(1-m)*z*3<0.1$, $(1-z)*3=0.095\sim0.135$, and $j*5=0\sim0.3$.

3. A fluorescent material, having a general formula of $((Lu_mA_{1-m})_zCe_{1-z})_3Q_5O_{12}$, wherein $0<m<1$, $0<z<1$, A comprises element Y (yttrium), element La (lanthanum), and element Gd (gadolinium), Q comprises at least one of element Al (aluminum), element Ga (gallium), and element In (indium), Lu is lutetium, O is oxygen, Ce is cerium, $2.3 \leq (m*z+1-z)*3 \leq 2.49$, and when the fluorescent material is excited by a light having a wavelength of 455 nm, the CIE 1931 chromaticity coordinates of an emitted light from the fluorescent material is $0.400<x<0.418$ and $0.560<y<0.570$.

4. The fluorescent material according to claim 3, wherein:
A has a general formula of $La_nGd_gY_{1-n-g}$, $0<n<1$, $0<g<1$;
Q has a general formula of $Al_rGa_jIn_{1-r-j}$, $0<r\leq1$, $0\leq j<1$; and $0<n*(1-m)*z*3<0.1$, $0<g*(1-m)*z*3<0.1$, $(1-z)*3=0.095\sim0.135$, and $j*5=0\sim0.3$.

5. A fluorescent material, having a general formula of $((Lu_mA_{1-m})_zCe_{1-z})_3Q_5O_{12}$, wherein $0<m<1$, $0<z<1$, A comprises element Y (yttrium), element La (lanthanum), and element Gd (gadolinium), Q comprises at least one of element Al (aluminum), element Ga (gallium), and element In (indium), Lu is lutetium, O is oxygen, Ce is cerium, $1.70 \leq (m*z+1-z)*3 \leq 2.29$, and when the fluorescent material is excited by a light having a wavelength of 455 nm, the CIE 1931 chromaticity coordinates of an emitted light from the fluorescent material is $0.418<x<0.426$ and $0.545<y<0.560$.

6. The fluorescent material according to claim 5, wherein:
A has a general formula of $La_nGd_gY_{1-n-g}$, $0<n<1$, $0<g<1$;
Q has a general formula of $Al_rGa_jIn_{1-r-j}$, $0<r\leq1$, $0\leq j<1$; and $0<n*(1-m)*z*3<0.1$, $0<g*(1-m)*z*3<0.1$, $(1-z)*3=0.095\sim0.135$, and $j*5=0\sim0.3$.

7. A light emitting device, comprising:
a light emitting element; and
the fluorescent material according to one of claims 1-5, and 6, wherein the fluorescent material is excited by a light emitted from the light emitting element and converts the light emitted from the light emitting element to emit a light having a wavelength different from the wavelength of the exciting light.

* * * * *